United States Patent [19]
Sramek, Jr.

[11] Patent Number: 5,345,236
[45] Date of Patent: Sep. 6, 1994

[54] IMPROVED SIGMA-DELTA TYPE ANALOG-TO-DIGITAL CONVERTER AND METHOD

[75] Inventor: John Sramek, Jr., San Ramon, Calif.

[73] Assignee: Harris Corporation, Melbourne, Fla.

[21] Appl. No.: 993,585

[22] Filed: Dec. 21, 1992

[51] Int. Cl.$^5$ .............................................. H03M 1/12
[52] U.S. Cl. ...................................... 341/144; 341/143; 341/155
[58] Field of Search ................ 341/141, 155, 143; 375/26, 27

[56] References Cited

U.S. PATENT DOCUMENTS 4,775,851  10/1988  Borth .................................. 341/143
4,972,360  11/1990  Cukier et al. ....................... 341/143

Primary Examiner—Brian K. Young
Attorney, Agent, or Firm—Henry I. Schanzer; C. C. Krawczyk; W. A. Troner

[57] ABSTRACT

A multiplexed sigma delta analog-to-digital (A/D) converter for low frequency applications has a single oversampling modulator together with a relatively high cutoff lowpass filter together with individual line frequency (50 or 60 Hz) rejection filters for each output channel.

10 Claims, 6 Drawing Sheets

IMPROVED SIGMA-DELTA TYPE ANALOG-TO-DIGITAL CONVERTER AND METHOD

CROSS-REFERENCE TO RELATED APPLICATIONS

Cofiled U.S. patent application Ser. No. 994,008, filed Dec. 21, 1992, and naming Farid Saleh as sole inventor, discloses related subject matter and is assigned to the assignee of the present application. This cross-referenced application is hereby incorporated by reference.

BACKGROUND OF THE INVENTION

1. Field of the Invention

The present invention relates to analog-to-digital converters, and particularly to sigma delta type converters with multiplexed channels.

2. Description of the Related Art

Digital processing and transmission of electrical signals has become commonplace in many industrial and consumer applications. Applying digital methods to analog information requires an analog-to-digital (A/D) conversion, but the needed linearity, resolution, and speed of such a conversion depends on the application. For example, many industrial control applications require A/D conversion with good linearity and high resolution (12-24 bits) but the necessary conversion or data throughput rate is relatively slow (20 Hz or less); whereas, video applications demand high speed (20 MHz or more) but tolerate lower resolution (8 bits) and poorer linearity. Intermediate speed applications (12 bits, 1-5 MHz) appear in document scanners and facsimile machines.

Industrial control and test and measurement applications typically monitor parameters, such as pressure and temperature, that essentially are slow time varying dc voltage levels. The measurements are performed by using a transducer to sense the physical parameter, such as temperature, and generate an analog electrical signal that the A/D converter transforms into a digital representation for processing in a computer or microprocessor. It is quite common in these applications to have several parameters (2 to 64) that must be sensed, digitized, and processed in a single control cycle, and for 1 to 20 control cycles to occur within one second. Because the A/D converter can be one of the more expensive elements in a system, it is often desirable to use an inexpensive multiplexer in front of a single A/D converter rather than devote an individual A/D converter to each transducer.

There are three types of A/D converters typically used in these industrial control applications: (1) integrating converters with 8 to 16 bit resolution which are inexpensive but slow (usually less than 50 conversions per second) and therefore have limited utility with multiplexers; (2) successive approximation register (SAR) converters with 12 to 16 bit resolution which are much faster and work well with multiplexers, however, these converters with their required sample-and-hold circuit are very expensive; and (3) sigma delta converters with 16 to 22 bit resolution which are inexpensive but slow based on existing architectures and have limited utility with multiplexers. A sigma delta converter capable of high channel count multiplexed operation would offer a very cost effective solution to many measurement requirements.

Sigma delta analog-to-digital converters consist of two major elements, a modulator that oversamples and digitizes an input analog signal, and a digital filter that removes unwanted noise. In low frequency industrial control and test and measurement applications, the filtering operation must remove internally generated quantization and other noise and externally generated line frequency noise.

The known sigma delta converters used for low frequency test and measurement applications have taken the approach of using single or cascaded lowpass digital filters to remove both the internal and external noise in a single operation. The converter throughput rate is typically taken as the lowpass $-3$ dB down filter attenuation point, and therefore throughput is limited by the lowest frequency signal to be filtered out. In all practical cases for low frequency test and measurement applications, the lowest frequency to be filtered out is the externally generated line noise frequency of 50 or 60 Hz. For these known sigma delta converters, the typical $-3$ dB point is between 10-20 Hz, resulting in a corresponding throughput rate of 10-20 conversions per second.

For example, see European Patent Application publication No. 0 458 524 A2, published Nov. 27, 1991, which is hereby incorporated by reference. In this publication the digital filter includes summations and subtractions mimicking the sigma delta modulator, and the filter resets at each channel change by the input multiplexer and thereby avoids filter settling time problems.

If input signals are multiplexed into a converter, the throughput rate is further reduced by the number of input channels and, in some cases, other settling/stabilization characteristics of the lowpass filter. Disregarding these stabilization characteristics, the throughput will be reduced by a factor equal to the number of channels. For example, each of eight inputs will have a throughput rate that is eight times slower than the rate for a single input channel.

SUMMARY OF THE INVENTION

The present invention provides a method and architecture for high channel count multiplexing into a sigma delta converter for low frequency measurement applications by partitioning the digital filtering. In one preferred embodiment, a sigma delta converter's high frequency sampling rate stabilizes low frequency signals, and the filtering process has two steps: a higher frequency filtering action that filters out internally generated noise sources but maintains a high throughput for the converter, and a lower frequency filtering action implemented on an individual channel basis using signal averaging that is tuned to filter out externally generated line noise.

DESCRIPTION OF THE PREFERRED EMBODIMENTS

Sigma Delta Converters

Figure 1:
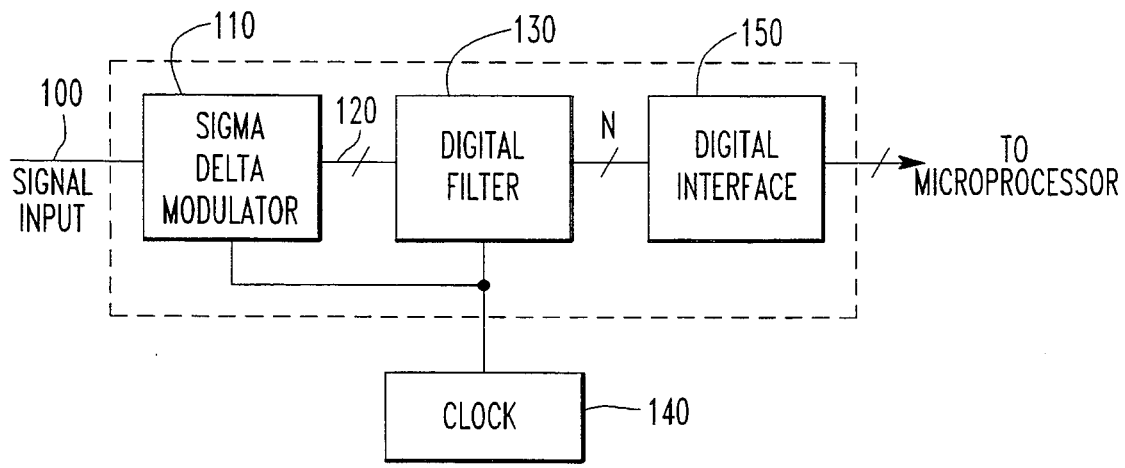
FIG. 1 shows the block diagram of known sigma delta converter architectures used for low frequency measurements.

In a typical sigma delta converter, as shown in FIG. 1, an analog signal 100 is fed into the device. The signal is compared in the modulator 110 to a referenced level that coverages on the analog signal 100 in a closed feedback loop to produce a one-bit data stream 120 representing the analog amplitude. The one-bit data stream 120 then goes into a digital filter 130 to remove quantization noise and other internally generated noise. According to the cross-referenced patent application of Saleh, proper selection of a clock 140 will also allow the notch of the digital filter 130 to be at the line noise frequency (50 or 60 Hz) and allow suppression of common AC line noise picked up through inductive and capacitive coupling. In addition to removing noise, the digital filter takes the 1-bit input data stream at a high sampling rate and decimates it to an N-bit data stream at a lower sampling rate. A digital interface 150 then provides the output of the digital filter 130 to a microprocessor or microcontroller.

The theory of operation of a sigma delta converter is well documented, and in essence an input signal is sampled at a frequency many times higher than the highest input frequency of interest using a simple 1-bit comparator in a feedback loop. The quantization noise is broadband white noise in nature, however, it is shaped by the integration performed in the modulator so that the noise floor is much lower at lower frequencies and greater at higher frequencies out of the range of interest. The digital filter then filters out this higher frequency noise allowing greater signal resolution at the low frequencies that are of interest. The actual signal-to-noise ratio and distortion specifications are a function of both the oversampling rate and the order of the integration in the modulator. For a specific maximum input signal frequency and modulator, the resolution of the converter can be increased by greater oversampling since the resultant quantization noise is spread over a wider bandwidth, and each doubling of the sample rate theoretically yields a 3 dB dynamic range improvement.

Figure 2:
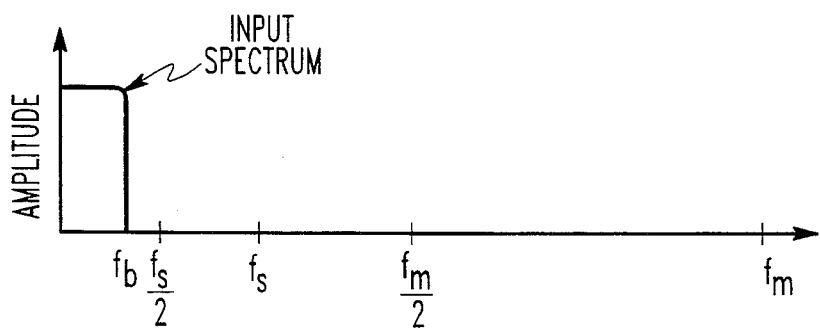
FIG. 2 illustrates the typical frequency spectrum of existing sigma delta architectures.

The typical frequency spectrum of existing sigma delta converters for low frequency measurement applications is shown in FIG. 2 with a modulator sampling rate of Fm, the usable bandwidth of the 1-bit sigma delta comparator is Fm/2 based on the Nyquist Sampling theorem. In the tradeoff of oversampling rate for resolution in a sigma delta converter, the effective sampling rate, Fs, represents that frequency that provides the desired resolution for the maximum input signal of interest if the signal were sampled with more conventional means, such as a common successive approximation register (SAR) converter. The input signal bandwidth, Fb, defines the usable range of the converter over which there must be minimal signal attenuation from the filter (Fb is commonly taken as the −3 dB down point).

Figure 3A:
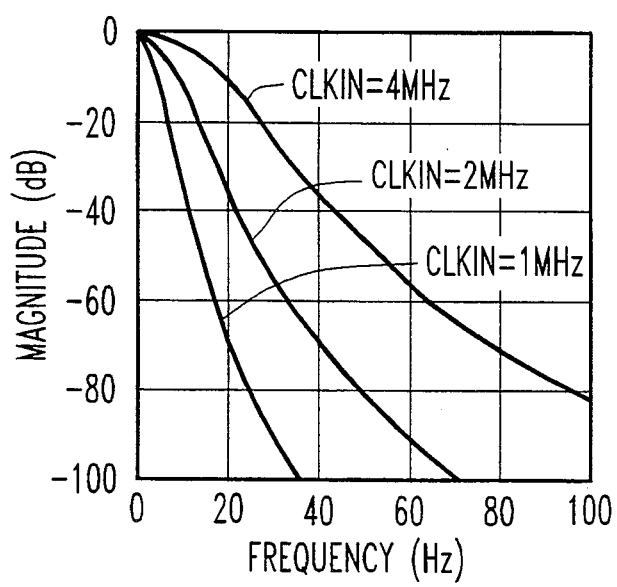
FIG. 3A shows the passband spectrum when a "brickwall" FIR filter is used to remove line noise.

For example, in FIG. 3A a finite impulse response (FIR) filter is shown with a sharp rolloff characteristic. This filter is used in the Crystal Semiconductor CS5501 sigma delta A/D converter, and Fb is approximately 10 Hz when the clock crystal is 4.096 MHz. With this clock rate, the CS5501 filter provides approximately 55 dB rejection at 60 Hz to signals coming in to either the data input or reference voltage pins. With Fb at 5 Hz, 60 Hz rejection increases to more than 90 dB.

Figure 3B:
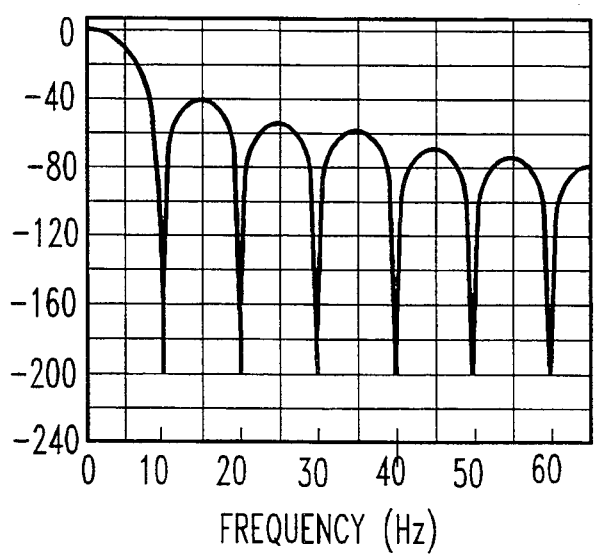
FIG. 3B shows the passband spectrum when a $(sinx/x)^3$ comb filter is used to remove line noise.

As a further example, in FIG. 3B the filter characteristics of the Analog Devices AD7712 are shown. The AD7712 uses a $(\sin x/x)^3$ or $\text{sinc}^3$ comb filter to achieve acceptable Fb and 60 Hz noise rejection with a simple implementation. Comb filters with N stages have a frequency response amplitude of approximately $$|H(f)| = [\sin (\pi f/F)/(\pi f/F)]^N$$

where f is the frequency variable and F is the first notch frequency of the comb filter.

By designing the comb filter to work with a specific clock so that the first notch frequency is an integral fraction of the AC line frequency, the rejection of AC line noise can be very high. See the cross-referenced patent application of Saleh. The −3 dB down point of the filter then establishes the usable frequency range without detrimental signal attenuation. For a comb with F=60 Hz and N=1, the −3 dB point is at f=17 Hz. Slowly varying DC signals, such as temperatures or pressures, can therefore be converted up to a rate of 17 conversions/second without detrimental signal attenuation.

Multiplexed Input

Figure 4:
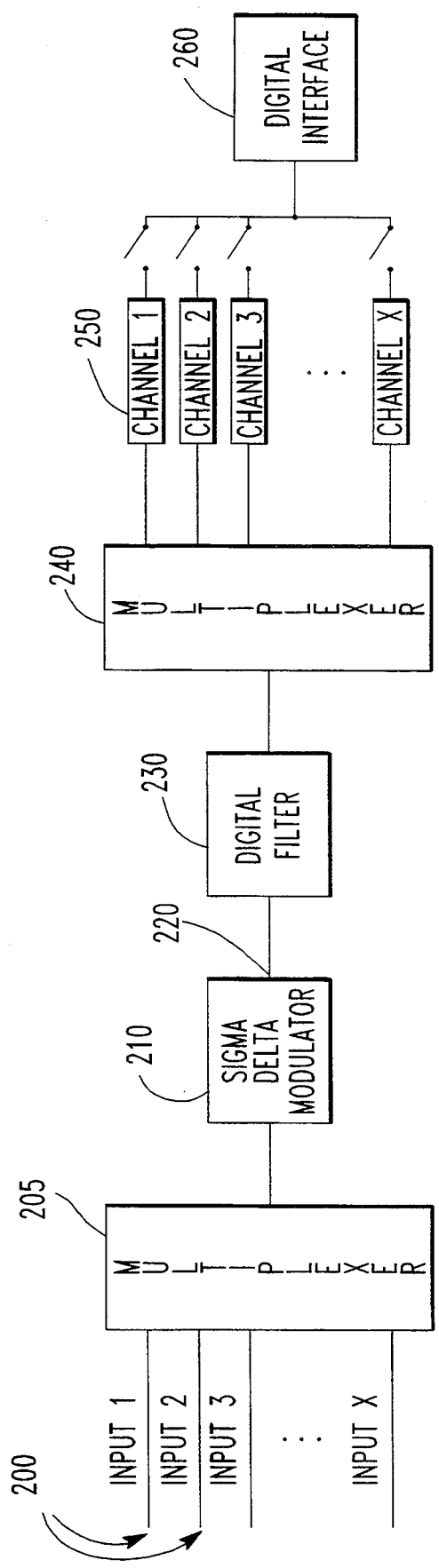
FIG. 4 shows the architecture of a first preferred embodiment sigma delta converter.

FIG. 4 shows a first preferred embodiment sigma delta converter with input signals 200 fed into a multiplexer 205 for selection. The modulator 210 provides a one-bit digital data stream 220 representing the amplitude of the selected signal to the digital filter 230. The digital filter 230 in this architecture, however, is designed to only filter out quantization and other relatively higher frequency (100 Hz or more) internally generated noise. The output of the digital filter 230 is then put into multiplexer 240 to feed a bank of data channel registers 250 where the data from individual channels is accumulated. Data for each channel is averaged to remove AC line noise on a per channel basis, and the final digital signal, thus filtered for both external and internal noise, is made available to a microprocessor through the digital interface 260.

Figure 5:
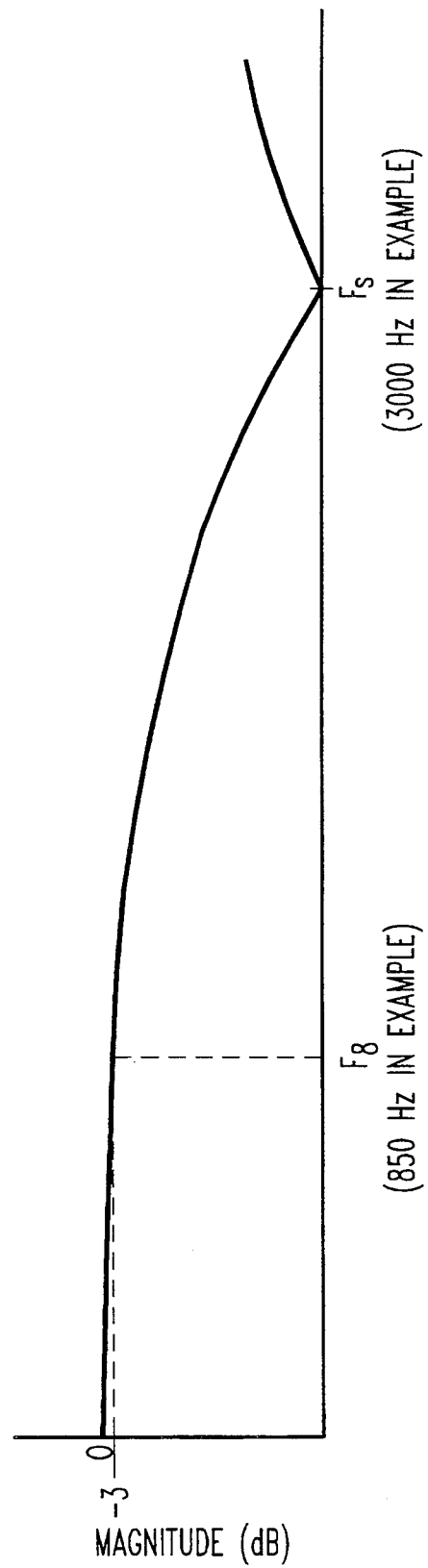
FIG. 5 illustrates the passband spectrum of the high cutoff lowpass filter used in the multiplexed first preferred embodiment.

Digital filter 230 is a lowpass filter and it can be a comb filter. FIG. 5 shows the passband spectrum for a comb filter example: when the first notch is at F=3000 Hz and N=1, the input bandwidth is Fb=850 Hz. Thus modulator 210 plus filter 230 of FIG. 4 has a conversion rate of about 850 conversion per second and establishes a high throughput for the overall converter. This allows about 42 input channels to be multiplexed and still have each individual channel maintain a conversion rate of 20 conversions per second. A modulator sampling rate Fm on the order of 1 MHz with a second order integrator in modulator 210 can then give better than 16-bit resolution for each channel.

The output of filter 230 will still be contaminated by AC line noise. Line noise can now be removed on a channel-by-channel basis by an additional filter for each channel or by signal averaging. In this manner, the overall converter throughput is maintained while the bottleneck resulting from the elimination of line noise is moved to simple filters in the individual channels.

Figure 6:
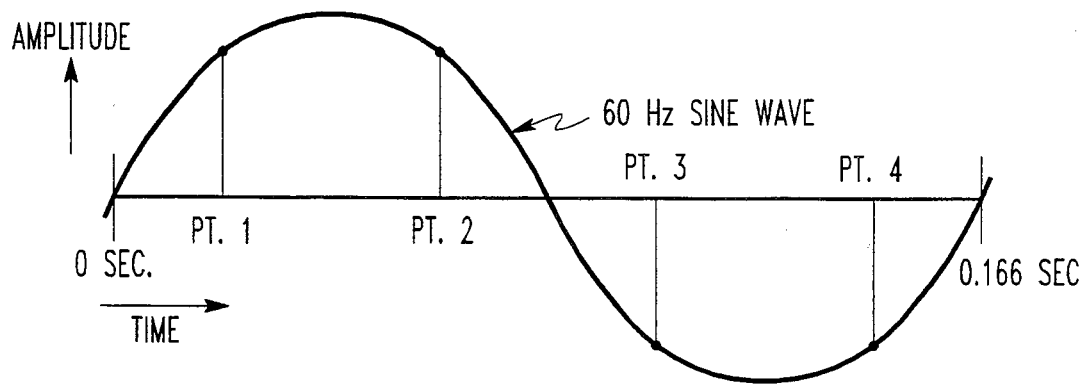
FIG. 6 shows waveform sampling that will provide an averaged result capable of attenuating line frequency signals.
Figure 7:
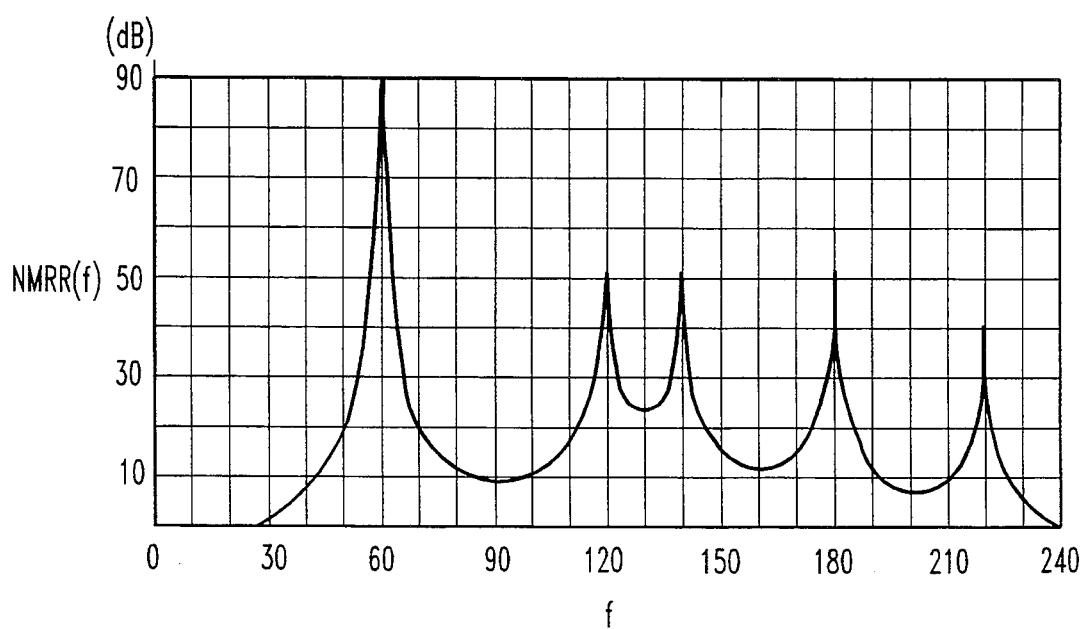
FIGS. 7A and 7B illustrate the response of the averaged signal and the attenuation at line frequencies.

By sampling the input signals at equally spaced multiples of AC line frequency, as shown in FIG. 6, and averaging the samples taken during one period of the AC waveform in the data channel registers 250 of FIG. 4, the AC line noise can be filtered out. Such integer sample averaging of line noise performs much like a comb filter, as shown in FIGS. 7A and 7B, where the average of four data points is simulated. One method for implementation would be to use a simple small two tap comb filter. In particular, for the example with filter 230 having Fb of 850 Hz and 42 channels, if multiplexer 205 sequentially selects the 42 channels four times during each period of the 60 Hz line frequency, then each channel will be selected for sampling about once every 4.2 milliseconds and for a duration of about 100 microseconds for each selection. Thus with modulator 210 sampling at a rate of 1 MHz, about 100 samples of the input signal in a channel are taken and passed into corresponding register 250 four times during each 60 Hz line frequency period.

Figure 8:
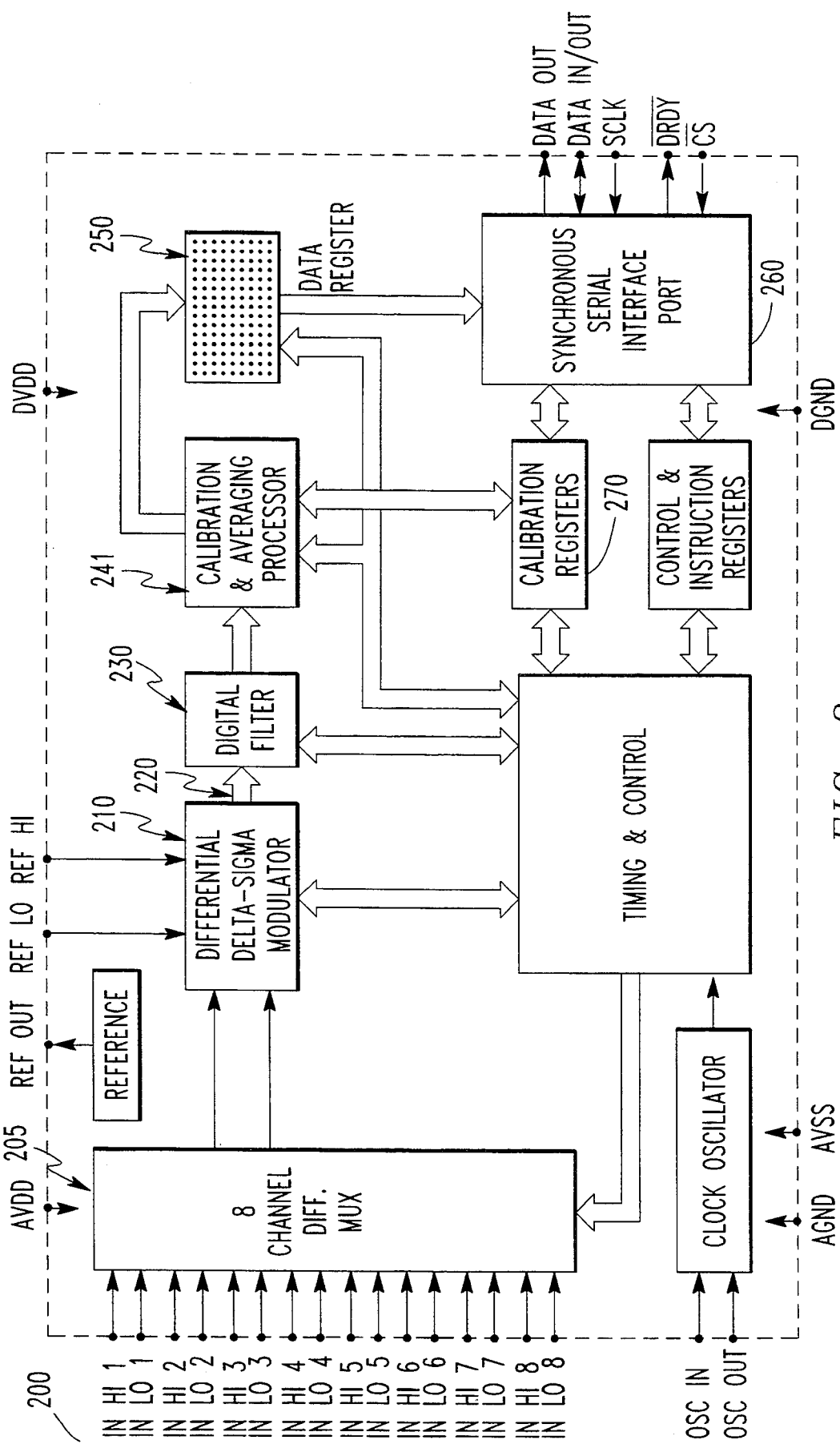
FIG. 8 shows the architecture of a second preferred embodiment sigma delta converter.

FIG. 8 shows a second preferred embodiment 8-channel multiplexed sigma delta converter in simplified block form. The elements have the same reference numerals as elements of FIG. 4; note that multiplexer 240 of FIG. 4 appears in calibration and averaging processor 241 of FIG. 8. With 8 channels and 8 output averages for each 60 Hz period, the converter of FIG. 8 sequentially samples each of the 8 inputs for durations of about 250 microseconds. This yields 500 samples per channel to compute each one of the outputs of filter 230 to average in processor 241 when the sampling frequency of modulator 210 is 2 MHz.

In particular, a comb filter with K taps has an impulse response of $$h(n) = 1 \text{ for } n = 0, 1, \ldots, K-1$$

0 for all other n and essentially just sums K consecutive data samples. The first notch frequency F is then the modulator sampling frequency Fm divided by K, and K input data samples are needed to compute an output filtered data sample. With F equal to 4000 Hz and a modulator sampling frequency Fm of 2 MHz, K equals 500. Thus when multiplexer 205 switches to a new channel, modulator 210 and comb filter 230 are reset, and then for the next 250 microseconds data samples from the new channel drive modulator 210 which outputs a stream of 500 bits to comb filter 230. Filter 230 sums the 500 bits to a number in the range of 0 to 500 and creates a single 9-bit output representing this sum in binary. Processor 241 adds this 9-bit output to the previous seven other 9-bit outputs corresponding to the same channel, and puts the average in the output register 250 corresponding to the input channel.

At the end of the 250 microsecond sampling modulator 205 switches to another channel and the cycle repeats for this channel. Note that filter 230 has decimated the sampling rate by a factor of 500 (from 2 MHz to 4000 Hz) because filter 230 only provides one output for every 500 data sample inputs. With a higher modulator sampling rate or fewer channels or a smaller number of filter taps, the decimation rate could be changed and filter 230 could output more than a single sample for each time interval that a channel feed modulator 210.

Because the input for each channel may be anywhere in the voltage range defined by the voltages at terminals REF LO and REF HI, the output 9-bit number may be conveniently offset and scaled prior to output. For example, with positive and negative inputs, two's complement output format may be convenient. Such calibration is programmed through interface 260 to load calibration values in registers 270. Processor 241 uses the calibration values in registers 270 to calibrate in addition to computing the averages.

Figure 9:
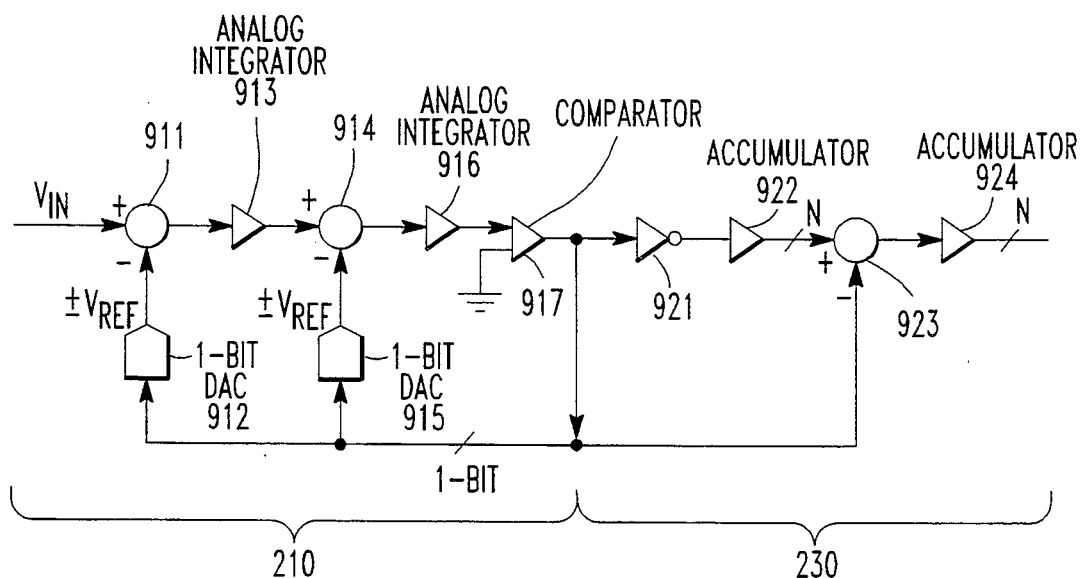
FIG. 9 shows a modulator and filter for use in the converter of FIG. 8.

FIG. 9 schematically shows a second order modulator 210 and filter 230 for use in the converter of FIG. 8; this second order modulator and filter were derived from the European Patent Application publication cited in the Background. Note that the clock and reset circuitry has been omitted from FIG. 9 for clarity. Modulator 210 in FIG. 9 operates as follows. At each clock period analog summing junction 911 adds input signal Vin to the negative of the output of digital-to-analog converter (DAC) 912. DAC 912 is a 1-bit converter and outputs either +Vref or −Vref. Analog integrator 913 adds the output of summing junction 911 to its current sum and outputs the new sum to summing junction 914. Summing junction 914 adds the sum from integrator 913 to the negative of the output of DAC 915 which duplicates the output of DAC 912. Analog integrator 916 adds the output of junction 914 to its current sum and outputs its new sum to comparator 917. Comparator 917 compares the sum to analog 0.0 and outputs a digital +1 if the sum is nonnegative and outputs a digital −1 if the sum is negative. (Comparator 917 could output +1 and 0 and processor 241 will provide the compensation for the average being ½ rather than 0.) The output of comparator 917 feeds back to drive DAC 912 and DAC 915. This negative feedback keeps the magnitudes of the analog sums in integrators 913 and 916 to less than 2 Vref. Note that only analog integrators and digital accumulators are used, and the filter has no multiplications and no stored coefficients to be read from memory.

The output of comparator 917 is filtered by digital filter 230 which includes inverter 921 feeding digital accumulator 922 and digital summing junction 923 combining the output of accumulator 922 and comparator 917 to be accumulated by output digital accumulator 924. The sum in accumulator 922 lies in the range of −M to +M after M clock periods from a reset, and thus the output to summing junction 923 is multi-bit. Similarly, the sum in accumulator 924 lies in the range of −M(M−1)/2 and +M(M−1)/2 after M clock periods from a reset. Note that integrators 913 and 916 may have their gains scaled for convenience, and in this case the accumulators 922 and 924 should have corresponding scaling. Indeed, with a second order modulator, a gain of ½ for each of integrators 913 and 916 is convenient. The magnitude of Vin is taken to be in the range −Vref/2 to +Vref/2 with Vref a reference voltage.

The two digital accumulators of filter 230 correspond to the two analog integrators in modulator 210, and filter 230 runs "in parallel" with modulator 210. On reset the integrators and accumulators are all set to 0

(analog or digital), and thus after M clock periods the analog sum in integrator 913 is $$\Sigma Vin(j)-C(j)Vref \quad \text{sum for } j=0,1,\ldots M$$

where Vin(j) is the input signal at the start of the jth clock period and C(j) is the output of comparator 917 (+1 or −1). Analogously, the sum in corresponding accumulator 922 after M clock periods is $$\Sigma -C(j) \quad \text{sum for } j=0,1,\ldots M$$

The gain of integrator 913 and accumulator 922 have been omitted for clarity. In a similar fashion, the analog sum in integrator 916 is $$\Sigma[\Sigma Vin(k)-C(k)Vref]-C(j)Vref \quad \text{double sum for } k=0,1,\ldots j; \text{ and } j=0,1,\ldots M$$

and the digital sum in corresponding accumulator 924, called D(M), is $$D(M)=\Sigma[\Sigma -C(k)]-C(j) \quad \text{double sum for } k=0,1,\ldots j; \text{ and } j=0,1,\ldots M$$

Thus the sum in integrator 916 can be expressed in terms of the sum in accumulator 924:

$$\Sigma\Sigma Vin(k)+D(M)Vref \quad \text{double sum for } k=0,1,\ldots j; \text{ and } j=0,1,\ldots M$$

Recall that Vin is essentially constant during the M clock periods if the total integrating and accumulating time is small, for example 500 microseconds, because Vin is slowly varying but with 60 Hz noise. Thus with Vin constant, the Vin(k) factors out of the summations, and the sum in integrator 916 then can be expressed in terms of the sum in accumulator 924 as $$VinM(M-1)/2+D(M)Vref$$

But the sum in integrator 916 has a magnitude of at most 2 Vref due to the negative feedback, and M(M−1)/2 is growing as $M^2$, thus D(M) is also growing as $M^2$ and Vin is approximated by $-D(M)Vref/[M(M-1)/2]$. The sum in integrator 916 essentially is the approximation error, which is just the quantization noise. Thus the approximation error has relative magnitude decreasing like $M^{-2}$. This means 16-bit resolution requires M to be roughly $2^8-2^9$ which implies 256-512 samples; of course, including the integrator gain factors will change this somewhat. With a modulator sampling rate Fm of 2.56-5.12 MHz, the 256-512 samples can be taken in 100 microseconds. This permits generation of 20 filtered output samples from each of the 8 channels during one period of the 60 Hz line frequency. Thus processor 241 could insure rejection of 60 Hz line noise plus several higher harmonics by averaging 20 filter outputs. Alternatively, more channels or higher resolution could be used with an averaging of only 4 samples by processor 241. Note that higher order modulators and filters, such as three analog integrators in series in modulator 210 plus three corresponding digital accumulators in filter 230, can provide higher resolution. And the same analysis applies for a 50 Hz power line frequency.

The synchronization of the converter clock with AC power line frequency as described in the cross-referenced patent application of Saleh may also be applied to the embodiments of FIGS. 4 and 8. This will insure rejection of AC power line noise by the averaging in registers 250 or processor 241.

Rough estimates of the integrated circuit size for one channel converters, such as those illustrated in FIGS. 3A-B, indicate that incorporation of multiplexers 205 and 240 plus replacement of a single digital filter with filter 230 plus averaging registers 250 for 8 channels as in FIG. 8 will only increase size by about 50%. Thus the preferred embodiment converter with 8 channels can provide a 700% increase in performance for only a 50% increase in cost (which roughly tracks integrated circuit size).

Further Modifications and Variations

The preferred embodiments could be varied while retaining the feature of a averaging filter in each output channel to reject line frequency noise for a multiplexed sigma delta modulator and filter with a cutoff much larger than line frequency.

Figure 10:
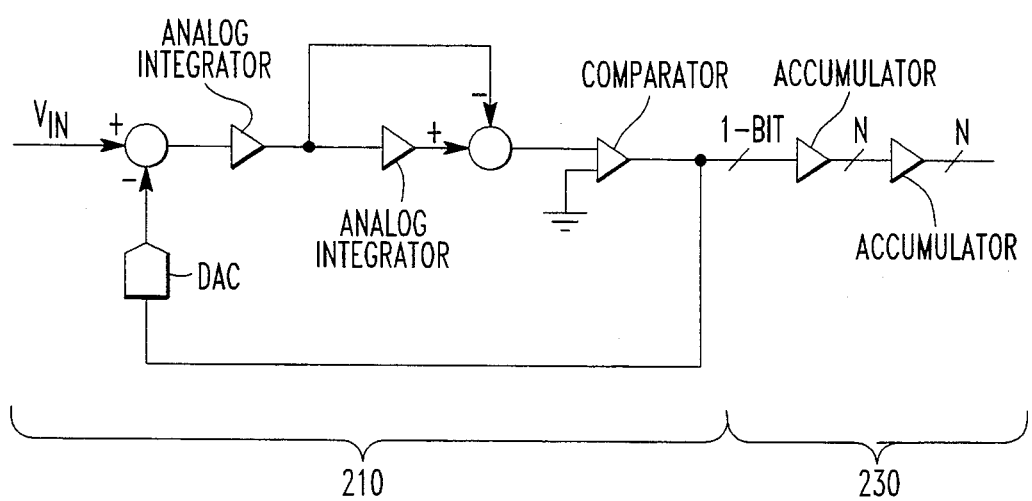
FIG. 10 shows another embodiment of a modulator and filter for use in the converter of FIG. 8.

In particular, various sigma-delta modulator and filter architectures could be used, for example the architecture of FIG. 10 or the other architectures illustrated in the European Patent Application publication cited in the Background. As in FIG. 9, the integrators and accumulators in FIG. 10 reset to 0 when the multiplexer switches to a new channel.

The same partitioning of the filtering into quantization noise filtering and power line noise may be applied to non-multiplexed converters in order to simplify the filtering and increase the throughput. Further, non-sigma delta converters which sample an input, such as flash converters, and output a stream of digital data may also benefit from an averaging filtering of their output stream to specifically reject AC line noise. In particular, if a converter samples at a rate Fm with Fm a multiple of 120 Hz, then averaging pairs of outputs which correspond to samplings offset by 1/120 second will yield averages in which 60 Hz noise has been rejected. Similarly, averaging over N outputs which correspond to samplings offset by 1/(N×60) second from each other also rejects 60 Hz and other harmonics; this requires Fm be a multiple of N×60 Hz. This also applies to 50 Hz AC line noise plus other frequency noise sources.

What is claimed is:

1. A multiplexed sigma delta analog-to-digital converter, comprising:
   (a) a sigma delta modulator with a modulator input and a modulator output;
   (b) an input multiplexer coupled between N signal inputs and said modulator input;
   (c) a digital filter coupled to said modulator output, said digital filter having a passband frequency of at least N times Fb, where Fb is a bandwidth for signals at said N signal inputs;
   (d) an output multiplexer coupled between said digital filter and N output filters; and
   (e) wherein said input and output multiplexers correlate said N output filters to said N signal inputs, and each one of said N output filters filters out a line frequency, Fline, where the frequency Fline is greater than Fb but less than N times Fb.

2. The converter of claim 1, wherein:
   (a) each one of said N output filters is an averaging filter; and
   (b) said input multiplexer selects each one of said N signal inputs for K equispaced time intervals during each period of the frequency Fline; with K being a positive integer greater than 1, and each one of said N output filters averages K outputs of said digital filter corresponding to one of said N signal inputs.

3. The converter of claim 2, wherein
said digital filter is a comb filter with −3 dB down point greater than about N times Fb.

4. The converter of claim 2, wherein:
   (a) N Equals 8;
   (b) K equals 4; and
   (c) The line frequency Fline equals the frequency of an AC power line voltage which may be approximately 50 to 60 Hz.

5. The converter of claim 2, wherein:
   (a) said modulator includes (i) one or more analog integrators in series and coupled to said modulator input, (ii) a digitizer coupled to said one or more integrators and connected to said modulator output, (iii) one or more digital-to-analog converters feeding back the output of said digitizer to said analog integrators;
   (b) said digital filter includes one or more digital accumulators with each one of said digital accumulators corresponding to one of said integrators; and
   (c) wherein said sigma-delta modulator and said digital filter includes reset means and wherein a reset of said modulator and said digital filter resets each of said one or more integrators and each one of said one or more accumulators.

6. The converter of claim 5, wherein
said digitizer is a comparator.

7. An analog-to-digital converter, said sampling converter
   (a) a sampling analog-to-digital converter, said sampling converter sampling at a rate of F; where F is an integer multiple of a frequency $f_{noise}$ and outputting a digital data stream; and
   (b) an averaging filter coupled to said sampling converter, said averaging filter averaging elements of said data stream corresponding to samplings of said sampling converter offset by a time equal to $1/(Nf_{noise})$ seconds; where N is a factor of said integer multiple.

8. The converter of claim 7, wherein
   (a) said sampling analog-to-digital converter is a sigma delta converter;
   (b) said $f_{noise}$ is the frequency of an AC power line voltage; and
   (c) N equals 4.

9. The converter of claim 8 wherein:
   (a) said sigma delta converter includes a modulator and a digital filter;
   (b) said modulator includes (i) one or more analog integrators in series and coupled to said modulator input, (ii) a digitizer coupled to said one or more integrators and connected to said modulator output, (iii) one or more digital-to-analog converters feeding back the output of said digitizer to said analog integrators;
   (c) said digital filter includes one or more digital accumulators with each one of said accumulators corresponding to one of said integrators; and
   (d) wherein said sigma delta modulator and said digital filter includes reset means and wherein a reset of said modulator and said digital filter resets each of said one or more accumulators.

10. A method of filtering the output of a sigma delta modulator, comprising the steps of:
    (a) applying an output stream from a sigma delta modulator to a low pass digital filter having a cut-off frequency greater than a frequency Fline where Fline is the frequency of a periodic noise source; and
    (b) averaging the outputs of said low pass digital filter at a rate which is N times the frequency, Fline, for integers of N greater than 1.

* * * * *